United States Patent [19]

Lindner

[11] Patent Number: 4,590,096

[45] Date of Patent: May 20, 1986

[54] WATER VAPOR, REACTION RATE AND DEPOSITION RATE CONTROL OF TIN OXIDE FILM BY CVD ON GLASS

[75] Inventor: George H. Lindner, Vlissingen, Netherlands

[73] Assignee: M&T Chemicals Inc., Woodbridge, N.J.

[21] Appl. No.: 687,067

[22] Filed: Dec. 28, 1984

[51] Int. Cl.$^4$ .................. C03C 17/245; B05D 5/12
[52] U.S. Cl. .................... 427/109; 65/60.52; 427/160; 427/166
[58] Field of Search .............. 427/109, 160, 166; 65/60.52

[56] References Cited

U.S. PATENT DOCUMENTS 4,265,974  5/1981  Gordon .................. 427/166 X
4,293,594  10/1981  Toldas et al. ............ 427/166 X Primary Examiner—James R. Hoffman
Attorney, Agent, or Firm—S. H. Parker; R. E. Bright; J. Mataon

[57] ABSTRACT

A chemical vapor deposition method for forming fluorine-doped tin oxide coatings uses a liquid coating composition which includes an organic fluorine dopant and an organotin compound. In the method, the gas stream contains sufficient water vapor such that its relative humidity at 18° C. is about 6% to 100%. A preferred liquid coating composition is monobutyltin trichloride and trifluoroacetic acid.

10 Claims, No Drawings

WATER VAPOR, REACTION RATE AND DEPOSITION RATE CONTROL OF TIN OXIDE FILM BY CVD ON GLASS

FIELD OF THE INVENTION

The invention relates to doped tin oxide coatings on glass and more particularly to low emissivity coatings for glass and methods of producing the coatings.

BACKGROUND OF THE INVENTION

It is known that these tin oxide coatings are useful for imparting to flat glass a heat reflective low emissivity surface. Such coating glass finds particular use in energy efficient windows as well as oven and refrigerator doors, sodium vapor lamps, incandescent and fluorescent lights.

These coatings are also useful as resistor heating elements for de-icing windows in airplanes or automobiles, as antistatic coatings on instrument panels, as electrodes for many types of optical-electronic devices and as protective coatings for bottles, optical fibers and carbon fibers.

Although the glass industry has sought to utilize the properties of tin oxide films to economically produce coated glass for energy efficient windows, success has been limited to low to medium performance products and high performance-high cost products. The desire, however, is for a high performance, economical, on-line applied tin oxide coating which provides a sheet resistance of 40 ohm/sq. at 250 nm, with visible transparency and infrared reflectivity approaching 90%.

Tin oxides films have been applied to glass by many techniques and most require an organic or inorganic tin precursor combined either chemically or physically with a material called a dopant. The dopant is responsible for imparting to the film the high conductivity and infrared reflectivity desired. Numerous materials have been used as dopants but the most effective for tin oxide contains the element fluorine, either bonded to the tin precursor directly, bonded to a group attached to tin or as part of a separate compound.

Doped stannic chloride and stannous chloride solutions have been sprayed directly onto hot glass to produce conductive tin oxide films. These films are often hazy in appearance, non-uniform in thickness, non-reproducible in application and have undesirably high sheet resistance (50 ohm/sq.). This is the result of using a corrosive, easily hydrolyzable chemical and an application method that is influenced by many variables. The presence of large volumes of solvent further complicates solution deposition processes. Some of these problems can be overcome when stannic chloride is applied by vapor deposition (CVD). CVD requires that the chemicals have sufficient vapor pressure below their decomposition temperature to deposit sufficient material. No solvents are used and uniform gas mixtures are readily attained and easily transported. U.S. Pat. No. 4,387,134 teaches that tin oxide films with sheet resistances of 1-10 ohm/sq were produced from a complex combination of vaporized water, methanol, HF, stannic chloride and $H_2/N_2$ gases. However, the films were at least 5000 Å thick, had transparencies as low as 60% and IR reflectivities as low as 50%, values totally unacceptable for residential window glass.

Gordon teaches in U.S. Pat. No. 4,265,974 that CVD of doped tetramethyltin produces tin oxide films with good optical and electrical properties. However, tetra methyltins' toxicity and the even greater toxicity of the by-products, combined with low rate of deposition on sheet glass, are serious disadvantages.

Another process which avoids the problems associated with solution spray, is that of fine powder deposition. U.S. Pat. No. 4,325,988 teaches that a very fine dust of a material with a particle size of less than 10 microns can be mixed with a carrier gas and transported to a hot glass surface where it decomposes to form an oxide film. Dibutyltin difluoride has been deposited in this way and a clear uniform film of $SnO_2$ can be produced with a sheet resistance of 20 ohms/sq. However, the solid must have a uniform size distribution and must be about to 1-2 microns in diameter. Producing material with a particular uniform size distribution and subjecting it to an additional grinding step is time-consuming, difficult and adds cost penalties to this deposition technique. Moreover, the design of application and recovery equipment is somewhat complex and the rate of deposition is slow.

Various vacuum techniques such as ion sputtering have been developed which produce clean, uniform tin oxide films with good properties but the cost of equipment is high, the process is a batch operation and the finished coated surface must be protected from the environment because of poor film adhesion to the glass.

U.S. Pat. No. 4,293,594 discloses a method for forming a highly conductive transparent coating on a substrate forming a vapor of mixed organic tin halide compound and an organic fluoride compound in an oxygen containing carrier gas and contacting a heated vitreous substrate with the organic tin halide containing carrier gas. The gas phase is heated to a temperature of about 190° C. to about 350° C. and the vitreous substitute is heated to a temperature greater than 350° C., e.g., 350° C. to 650° C.

While the U.S. Pat. No. 4,293,594 patent does not teach a generic class of compounds suitable for use as the organic tin halide precursors for the tin oxide film formed, the compounds disclosed by the patent can be described by the formula $$R_a SnX_b$$

wherein R is methyl, ethyl, butyl or phenyl; X is halogen, preferably chlorine; and a and b are integers selected so that a+b=4. Illustrative of the compounds disclosed are dimethyltin dichloride, triethyltin chloride, butyltin trichloride, dibutyltin dichloride and triphenyltin fluoride.

Compounds disclosed as being suitable dopants for the tin oxide film include dimethyl tin difluoride, ammonium acid fluoride and phosphorous pentoxide. However, many of the compounds disclosed have such low vapor pressures or high melting points that they could not be vaporized in accordance with the teachings of the patent.

An earlier patent, U.S. Pat. No. 3,677,814, disclosed the use of fluoride containing tin compound, where a fluoride atom is attached to the tin, to simultaneously form the tin oxide film and dope it to be electrically conductive. Alkyl and aryl tin compounds of the formula $RxSnF_{4-x}$ wherein x is an interger of 1 to 3 and R is alkyl or aryl are alleged to be useful in the practice of the invention. The tin oxide films are prepared by spraying a solution of the organotin fluoride in a hot glass surface, e.g., 1300° F. Only dibutyltin difluoride is illustrated. Large quantities of solvent are required to solubilize this poorly soluble material.

U.S. Pat. Nos. 4,389,238 and 4,130,673 disclose apparatus and methods for coating glass bottles with tin oxide in order to reduce the coefficient of friction of the glass, thereby reducing breakage. The latter patent teaches the use of butyltin trichloride as the precursor for the tin oxide which is formed by spraying the hot bottles with butyltin trichloride in an air stream from an atomizer orifice.

Japanese KoKai No. 75,61,415 discloses the combination of dibutyltin diacetate, ethythdifluoroacetate dissolved in isopropyl alcohol as being useful for the preparation of doped $SnO_2$ films. However, these solutions give doped tin oxide films with resistivities about one order of magnitude higher than those achieved by the process of the invention of this disclosure. U.S. Pat. No. 3,949,146 discloses as useful tin oxide precursors compounds of the formula $R_2Sn(OOCR)_2$ or $(R_3Sn)_2O$ wherein R is a lower alkyl, and inferentially teaches that the presence of water vapor in the carrier gas stream improves film conductivity. However, the disclosure makes no mention of the importance of dopant selection or water vapor levels required. The disclosure, when followed, will result in a product having unacceptably low conductance.

European Patent Office Publication No. 0 112 780, published July 4, 1984 discloses the use of butyltin trichloride to form conductive films of tin oxide using dichlorodifluoromethane as the dopant.

The selection of particular dopants for stannic oxide films and process parameters for the production of such electrically conductive films forms the basis of this invention.

SUMMARY OF THE INVENTION

It has surprisingly been found that certain combinations of reactive fluorine containing organic compounds where at least one fluorine atom is alpha or beta to a functional group with organotin halides will produce stannic oxide films on vitreous substrates which have improved optical and electrical properties. The preferred tin halide is monobutyltin trichloride and the preferred fluorine compounds are trifluoroacetic acid and ethyltrifluoroacetoacetate.

DESCRIPTION OF THE INVENTION

This invention relates to novel organotin compounds which when oxidatively pyrolyzed on hot glass will produce tin oxide films. In particular, it relates to novel organotin compositions which in conjunction with particular dopants produce tin oxide films on glass which are haze free and have high visible light transmittance, infrared reflectivity and good electrical conductivity.

The compositions of this invention contain a liquid or low melting organotin compound, a fluorine dopant which is either soluble in the organotin compound or capable of being solubilized, and an optional fluoride solubilizer. The dopants of this invention work equally as well if vaporized separately from the organotin.

The tin compounds can be represented by the general formulae:

$$RSnCl_3 \qquad \qquad I$$

where
R is halogen, a $C_1$ to $C_4$ straight or branched chain alkyl, phenyl or $R^1CH_2CH_2-$;

R' is R"OOC or $CH_3OC$;
R" is a $C_1$ to $C_4$ alkyl;

$$R'''_2SnCl_2 \qquad \qquad II$$

where
R''' is a $C_1$ to $C_4$ straight or branched chain alkyl; or $$R''SnCl_n(O_2R'')_{3-n} \qquad \qquad III$$

where

R" is a $C_1$ to $C_4$ alkyl or substituted alkyl; and
n is 1 or 2.

The preferred organotin compounds are those having the formula $R_aSnX_{4-a}$ wherein R is as previously defined, a is 1 or 2 and X is halogen. Preferably, X is Cl. The substituent on the alkyl group of the tin compound is preferably halogen.

Illustrative non-limiting examples of the organotin compounds suitable for use in the practice of this invention are methyltin trichloride, ethyltin trichloride, propyltin trichloride, isopropyltin trichloride, butyltin trichloride, isobutyltin trichloride, sec-butyltin trichloride, t-butyltin trichloride, and the diorganotin dichloride counterparts to the foregoing. Additional examples include phenyltin trichloride, $CH_3OOC(CH_2)_2SnCl_3$, and the ethyl, propyl and butyl ester counterparts as well as $CH_3OC(CH_2)_2SnCl_3$, butyldichlorotin acetate, and butylchlorotin diacetate. The organotin compounds of this invention are normally liquid or low melting solid compounds.

The dopants suitable for use in the practice of this invention are reactive fluoride containing organic compounds with boiling points below 250° C. where at least one fluorine atom is located alpha or beta to a functional group. The functional group can be a carboxylic acid, ester, aldehyde, anhydride, nitrite, ketone, ether, amine, acid halide, alcohol, halogen, amide or hydrogen.

Illustrative non-limiting examples of the dopants suitable for use in the practice of this invention:
trifluoroacetic acid,
ethyltrifluoroacetate,
ethyltrifluoroacetoacetate,
trifluoroacetic anhydride,
1,1,1-trifluroracetone,
trifluoroacetylacetone,
2,2,2-trifluoroethyl amine,
2,2,2-trifluoroethyl iodide,
2,2,2-trifluoroethanol,
trifluoromethane,
pentafluoropropionic acid
fluorobenzene,
fluorobenzotrifluoride.

The optional solubilizers include normally liquid hydrocarbons, organic esters, anhydrides, acids, ketones, ethers and the like which have boiling points below 250° C. They can be used to impart solubility between the organotin and the dopant or to insure low temperature stability of the novel compositions.

Some fluorine containing dopants have a limited solubility in the organotin halide. By use of the optional solubilizers the solubility of fluoride compound in the organotin halide is significantly increased.

While some of the optional solubilizers, e.g., hexane, will be recognized as conventional solvents, they are not used as such in the practice of this invention. Both the organotin halides and the fluoride compounds of this invention are ordinarily both liquids and miscible with one another. Furthermore, in a solution the solvent generally constitutes a major portion of the solution. In the practice of this invention the optional solubilizer is present at about 25 wt% or less, based on the weight of organic halide, dopant and solubilizer together.

In addition to permitting a higher concentration of dopant to dissolve in the organotin halide, the organotin halide/dopant solution is stabilized against low temperature separation by use of the optional solubilizer. As a result, solutions of the organotin halide and dopant will remain clear at temperatures below $-15°$ C., whereas without the use of the optional solubilizer the solutions became hazy evidencing separation. This phenomenon is especially important in severe climates where chemicals may be stored outdoors in winter weather.

The term "solubilizer" as used in the specification and claims means a polar organic compound which is a solvent for both the organotin compound and the dopant. Illustrative non-limiting examples of the solubilizers of this invention are acetic anhydride, ethylacetate, hexane, methyl isobutyl ketone and butyraldehyde.

The compositions of this invention can be utilized as vapors or as nebulized liquids. For vapor deposition the following methods were used.

Method A—dry air under controlled pressure and flow in $\frac{1}{4}''$ stainless steel (SS) tubing is passed in separate streams through a gas drier and a water bath. The air emerging from the streams, which now contains a fixed amount of water vapor, is combined and passed through a heated oil bath and then a heated metal mixing chamber where the organotin composition is vaporized as it is injected at a controlled rate. The heated mixture of air, water vapor and doped tin compound is then passed through a second heated oil bath to raised its temperature further. The heated vapors then enter the top of a heated vertical tube of fixed diameter and length and drop down upon a glass slide heated to the desired temperature via a heated block of copper.

If a gaseous dopant or a separate liquid component is desired it may be fed into the air mixture at a point before the first heated oil bath.

Method B-Air under controlled pressure and flow in $\frac{1}{4}''$ SS tubing is passed separately through a gas dryer and a water trap, combined and then passed through an in-line hygrometer. The air of known water content then passes through an electric heater and into an expansion chamber $\frac{1}{2}''$ in diameter. The organotin composition is injected into a nitrogen swept heated injection block at a controlled rate where it immediately vaporizes and passes into the hot-air stream at the beginning of the expansion chamber. The heated mixture of air, water vapor and doped tin compound now passes through a vertical tube of the same diameter enclosed in a 2 inch hot air insulated tube and impinges on a glass slide heated in the same manner as in Method A. If a gaseous dopant is required it is fed into the air mixture at a point before the expansion chamber. The entire apparatus is wrapped with 2 inch thick bats of high temperature insulation.

For nebulized liquid deposition the apparatus described in Method B is used with the following modification. The heated injection block is replaced with a vertical glass tube fitted to an ultrasonic generator into which the solution of doped organotin is placed. The generator is activated and a fine mist with a droplet size of 10 microns or less is produced at a constant rate. A low velocity stream of a carrier gas (air, nitrogen or oxygen) is passed into the generator to transport the mist into the hot air stream. Deposition occurs as described before.

When the novel compositions are deposited by chemical vapor deposition ("CVD") Method A or B, the organotin, dopant and solubilizer, if used, may be mixed at room temperature or added separately. The solubilizer concentration can range from about 1 to about 10% (by weight) based on the total composition of organotin compound, dopant and solubilizer, and is preferably no greater than about 6%. Dopant concentrations range from about 1 to about 60 wt% based on the total composition with the preferred range being 3-20%. Carrier gas or air temperature may vary from about 100° C. to about 400° C. with the preferred range being about 150° C. to about 250° C. The glass surface temperature may range from about 400° to about 700° C. with the preferred range being about 500° to about 650° C. Linear air velocities can range from about 1 to about 15 l/min. with the preferred range being about 9 to about 14 l/min. for Method A and about 1 to about 4 l/min. for Method B. The relative humidity of the air greatly influences the rate of deposition and may vary from 0-100% depending on the dopant composition used.

When the novel compositions are deposited by the nebulized solution method, the organotin plus dopant content of the solutions range from about 1 to about 50% wt% based on the weight of solution and an alcohol solvent such as methanol can be used. The preferred solvent range is about 25 to about 35 wt% organotin plus dopant. Any organic solvent which is a solvent for each of the constituents may be used. Illustrative examples of suitable solvents are methanol, isopropyl alcohol, hexane, octane, benzane, zylene, etc. The concentration of dopant in organotin can vary from about 5 to about 50% with the preferred range being about 10 to about 30%. Air temperature ranges from about 100° C. to about 400° C. with the preferred range being about 200° C. to about 350° C. The glass temperature and relative humidity ranges are the same as those noted above. Air velocities range from about 2 to about 60 l/min. with the preferred range being about 5 to about 20 l/min. The mist carrier gas velocities range from about 0.5 to about 5 l/min with the preferred range being about 1 to about 2 l/min.

The sheet resistance (ohms/sq) of the tin oxide film is measured with a conventional four point probe according to ASTM standard method F374-81.

The film thickness (A) is measured by the beta-backscatter method according to British Standards Institution method BS5411: Part 12, 1981, ISO 3543-1981.

The % infrared reflectivity is measured by a specular reflectance technique described by J. Stewart in "Infrared Spectroscopy", Marcel Dekker, Inc., N.Y. 1970 p. 539 ff. The visible transmittance is measured on a UV/vis spectrophotometer over the 400-800 nm region, versus air and the % $T_{vis}$ is averaged over the wavelengths.

The bulk conductivity was determined from the sheet resistance and the film thickness according to the well known relationship.

$$\sigma = 1/(R_\square \cdot t)$$

where
$\sigma$ equals conductivity in $(\text{ohm cm})^{-1}$
$R_\square$ equals sheet resistance in ohms/sq.

t equals film thickness in centimeters.

Films prepared according to the preferred embodiments of the invention have infrared reflectivities greater than 70% at the conventional 10 micron wavelength of light which is characteristic of infrared radiation at room temperature, visible transmittance of 80% or greater sheet resistances <40 ohm/sq. and conductivities greater than 1250 $(ohm\ cm)^{-1}$ for films 1600–2500 nm thick. The films show a very light orange color in transmitted light and a light blue iridescence in reflected light.

The CVD methods of deposition described herein are preferred because of the ease of application of homogeneous gaseous mixtures and the speed of deposition. The absence of a non-reactive solvent appears to at least in part, contribute to the speed of application and the quality of the coating.

Conditions can be varied to permit a wide range of organotin compounds and dopants to be utilized to prepare hard, resistant films with acceptable transmittance, reflectance and conductivity. The glass to be coated is generally made by the flotation process. The sheet resistance at about 160 to 250 nm must be 40 ohm/sq. or less. While thicker films can be used to lower sheet resistance of $SnO_2$ film, above 250 nm the light transmittance of the glass is reduced below acceptable levels. Below 160 nm thickness the $SnO_2$ film permits to great heat loss from a room protected by such glass, and generally, the conductivity of the glass will be too low. Therefore, in selecting suitable combinations of organotin compound and dopant, the targets used are a deposition rate such that a film of $SnO_2$ oxide of about 160 nm to 250 nm can be laid down having a sheet resistance of 40 ohm/sq. or less.

The advantages of this invention can be more readily appreciated by reference to the following examples. It should be noted that the results shown in the Tables are the best achievable over a range of process conditions. While some of the combinations illustrated gave less than acceptable results, they are included to demonstrate that not all organotin/dopant combinations result in tin oxide films with the designed properties.

EXAMPLES 1–22

The following examples demonstrated the scope of the invention and the preferred embodiments.

Examples 1–22 demonstrate the effectiveness of various dopants with monobutyltin trichloride as the organotin compound. Examples 1 to 9, 13 to 18, 20 and 21, were conducted using the apparatus described in Method A and 1 mm soda-lime glass. Examples 10 to 12 and 19 were conducted using the apparatus of Method B and 2 mm soda-lime glass.

The infrared reflectivity of the tin oxide film produced in Example 5 was 74% as measured at 10 microns.

All examples in Table 1, which utilized the mist generator method, were conducted on soda-lime glass heated on a 650° C. hot block. The carrier gas was air heated to about 260°–280° C., flowing at 10 l/min. The mist carrier gas was unheated nitrogen flowing at 1 l/min. All depositions were conducted for 30 to 60 seconds depending on the thickness desired.

Comparing run 6 (MBTC) with runs 1 to 5, it is apparent that under appropriate conditions trifluoroacetic acid (TFA) is an acceptable dopant for MBTC.

It is apparent from Examples 15 (4-fluorobenzene) and 16 (o-fluorobenzotrifluoride) that not all organoic fluorides are effective as dopants for MBTC.

Examples 1 and 2 show the effect of moisture on deposition time and sheet resistance for low solution addition rate. Examples 3 and 4 demonstrate the effect of solution addition rate on deposition time. At the higher addition rate deposition time is dramatically reduced.

While it appears from Example 7 that trifluoroacetic anhydride (TFAA) is not an acceptable dopant it should be noted that the results were obtained at 0% RH. When water vapor is present in the gas stream, TFA is formed in situ. Hence, TFAA can be used as a dopant when moisture is present.

While dibutyltin difluoride and ammonium fluoride are dopants for some organotin compounds they are not effective dopants for MBTC.

EXAMPLES 22–32

These examples demonstrate the effectiveness of TFA and ethyl-4,4,4-trifluoroacetoacetate (ETFAA) as dopants for a wide range of organotin compounds. The experiments were conducted using Method A and the procedure of Example 1. The results are shown in Table II. It is apparent that TFA is an effective dopant to form the conductive stannic oxide films of this invention. In this respect, TFA is unique in that its effectiveness as a dopant is not dependent on the particular organotin compound used.

ETFA was found to be an effective dopant for MBTC and methyltin trichloride (MTC). A comparison of Examples 31 and 32 suggests that MEK is not a suitable solubilizer for ETFAA.

While the previous Examples 1–32 utilize organotin compounds as the tin oxide precursor, tin tetrachloride (TT) is commonly used for this purpose. TFA was used as the dopant for TT in Example 33 repeating the procedure of Example 1, Method A. The results as shown in Table II demonstrate that TFA is an effective dopant for TT.

EXAMPLES 34–40

These examples were conducted using nebulized solutions where the solvent was methanol. Again, MBTC alone shows a high sheet resistance Table III (Example 34). According to the teaching of Japanese KoKai No. 75,61,416 ETFA is an effective dopant for dibutyltin diacetate when used in a nebulized solution (isopropyl alcohol solvent). In a solvent system ETFA is not an effective dopant for MBTC. It should be noted that acceptable sheet resistance as disclosed in KoKai No. 75,61,416 is almost an order of magnitude greater than what is acceptable for the purpose of this invention. As seen from Example 37, a sheet resistance of 82 was obtained. By comparison, when used for CVD (solventless deposition) with MBTC, ETFA is an effective dopant (compare Example 11). Hence, again there is no clear predictability of the results achievable with a particular dopant.

EXAMPLE 41

The effect of Relative Humidity on deposition rate of stannic oxide was evaluated. The method of Example 1 Method A and B was used to deposit the film. The results are shown in Tables IV and V. The data show that an increase in RH will generally increase the deposition rate. The relative magnitude of the increase is dependent on such parameters as addition rate and air flow.

EXAMPLE 42

The method of Example 41 was repeated for various organotin compounds using trifluoracetic acid as the dopant to evaluate the effect of humidity on deposition rate. The results are shown in Table VI.

EXAMPLE 42

Using the method of Example 41, the effect of air flow on deposition rate was evaluated. The organotin compounds used were MTC with TFA as the dopant and acetic anhydride as the cosolvent (Example 19). The results are shown in Table VII. For a fixed concentration, the deposition rate is directly dependent on air flow rate.

EXAMPLE 43

Example 41 was repeated to further evaluate the effect of organotin halide concentration. It was found that deposition rate was directly proportional to MBTC concentration. The results are shown in Table VIII.

EXAMPLE 44

The effect of glass temperature on the stannic oxide deposition rate was studied using the procedure of Example 41. It was found that, generally, as temperature was increased deposition rate increased. However, at above about 500° C. glass temperature had no effect on deposition rate. For maximum deposition rate of stannic oxide the glass temperature should be at least 500° C., preferably at least 550° C. The results are shown in Table IX.

EXAMPLE 45

The water sensitivity of the TFA dopant-MBTC system was studied using the method of Example 38 by preparing samples of various concentrations using acetic anhydride and ethylacetate as cosolvents and measuring the film resistance at about 185 mm thickness.

Acetic Anhydride Co-solvent

The TFA level was varied from 2 to 24 pph based on MBTC with the acetic anhydride present at about 36 wt% of the TFA. The film resistance was determined as a function of the mole ratio M where $$M = \frac{[H_2O] \times [Air]}{[TFA] \times [MBTC]}$$

wherein each component is expressed in moles. The film resistance was relatively constant up to a mole ratio (M) of 20,000 above that level film resistance increased rapidly. Hence for optimum deposition rate and film resistance M is preferably less than 20,000.

Ethyl Acetate Co-solvent

The TFA and ethyl acetate were utilized at concentrations of 5 pph and 2.5 pph respectively, based on the MBTC, at feed rates varying from 10 to 60 ml/hr. The water vapor was varied from 0% to 100% relative humidity. The film resistance approached the 80 ohm level (185 mm thickness) when M was about 30,000. These results are substantially the same as those achieved for acetic acid cosolvent.

EXAMPLE 46

Example 44 was repeated to determine the effect of glass temperature on film resistance of the stannic oxide film. The composition of Example 18 was used. The mole ratio, M, for the system was $9.03 \times 10^3$. There was a pronounced drop in film resistance as glass temperature increased. Above about 500° C. glass temperature, however, the effect of increasing glass temperature on film resistance was minimal. Hence, to minimize film resistance, the glass temperature is preferably at least 500° C., more preferably at least 550° C.

EXAMPLE 47

In order to be able to store and ship organotin halide mixed with a dopant, the solution must be stable at low temperatures.

For low temperature stability tests, 1 ml of TFA was mixed with 0.5 ml MBTC and cosolvent added. The result at °C. and −15° C. is shown in Table X. The two numbers which appear opposite "−15° C.", e.g., 5/20, indicate phase separation into an upper layer (5 mm) and a lower layer (20 mm).

EXAMPLE 48

Organotin compounds produced commercially contain minor amounts of $SnCl_4$ as an impurity. This causes crystal formation at low temperatures. While methanol is not a preferred ingredient of an electrically conductive coating material, it does inhibit crystal formation. The effect of various cosolvents on $SnCl_4$ induced crystal in MBTC was evaluated. Mixtures were made of 10 g MBTC with 5 pph $SnCl_4$, 1 pph $H_2O$ and 0.6 g TFA. Crystal formation appeared after $H_2O$ addition and more crystals appeared after TFA addition. Cosolvents were added to the system until all crystals disappeared from the test tube wall. Additional cosolvent was added until the liquid was clear. The results are shown in Table XI.

EXAMPLE 49

To more closely approximate actual conditions with commercial materials, a mixture was made of ultra-pure (99.8%) MBTC with 0.4 pph $SnCl_4$ and 0.3 pph $H_2O$. Seven capsules were filled and 5.2 pph of TFA added to each. Further addition of zero to 6 pph of Aceticanhydride gave the results shown in Table XII.

It will be evident to those skilled in the art who have reference to this disclosure that the process of this invention is advantageously carried out in the presence of moisture. In its preferred embodiment the CVD process of this invention is carried out with the carrier gas having a relative humidity as measured at 180° C. of about 6 to about 100%; preferably about 14 to 80%; more preferably about 35 to 60%.

The parameter M is defined in general terms by the expression:

$$M = \frac{(H_2O) \times (AIR)}{(D) \times (O)}$$

wherein the $(H_2O)$ and (AIR) are expressed in moles; (D)=moles of fluoride dopant and (O)=moles of organotin compound.

Hence, where the (AIR) is expressed in terms of flow rate, e.g. moles/hr. rather than total moles, the other parameters will be expressed in rate terms and all physical parameters for the process, other than temperature, are defined by the equation. M is preferably less then 50,000 for the process of this invention; preferably less than 30,000; more preferably less than 20,000.

While tin tetrachloride is not an organic compound, for the purpose of this disclosure the term "organotin compound" includes $SnCl_4$.

With respect to the solution of dopant in organotin compound, the term "substantially solvent free" permits the inclusion of minor amounts of solubilizer in the organotin/dopant solution.

TABLE 1

| | Example No. | | | | | | | | | | |
|---|---|---|---|---|---|---|---|---|---|---|---|
| | 1 | 2 | 3 | 4 | 5 | 6 | 7 | 8 | 9 | 10 | 11 |
| | Composition (% by wt) | | | | | | | | | | |
| | 5.7% TFA 94.3% MBTC | 5% ETFAA 95% MBTC | | 5% FB 95% MBTC | 5% FBTF 95% MBTC | 100% MBTC | 4.8% TFAA 95.2% MBTC | 16% TFE 84% MBTC | 92% TFM 8% MBTC 13440 TFM (STP) 4.9 MBTC | 6% TFA 94% MBTC | 25% ETFA 75% MBTC |
| Rate of solution addition (ml/hr) | 3.24 | 3.24 | 19.4 | 19.4 | 9.7 | 6.5 | 6.5 | 9.7 | 4.9 | 14 | 26 |
| Temperature of carrier air (°C.) | 140–160 | 140–160 | 140–160 | 140–160 | 140 | 140–160 | 140–160 | 150 | 150 | 180 | 150 |
| Flow rate of carrier air (l/min.) | 12 | 12 | 12 | 12 | 12 | 12 | 12 | 12 | 12 | 2.5 | 10 |
| Relative humidity of air (%) | 0 | 100 | 0 | 100 | 14 | 100 | 47 | 0 | 14 | 14 | 0 |
| Temperature of heating block (°C.) | 560 | 560 | 560 | 560 | 630 | 560 | 560 | 560 | 500 | 625 | 620 |
| Deposition time (sec) | 58 | 21 | 32 | 6 | 9 | 13 | 14 | 41 | 30 | 10 | 18 |
| Sheet resistance R (ohm/sq) | 28 | 80 | 36 | 37 | 28 | 286 | 26 | 25 | 51 | 37 | 24 |
| Film thickness (nm) | 185 | 175 | 194 | 198 | 187 | 190 | 200 | 224.4 | 220 | 191.8 | 200 |
| Conductivity (ohm cm)$^{-1}$ | 1931 | 723 | 1432 | 1365 | 1910 | 184 | 1923 | 1786 | 891 | 1408 | 2083 |

| | Example No. | | | | | | | | | |
|---|---|---|---|---|---|---|---|---|---|---|
| | 12 | 13 | 14 | 15 | 16 | 17 | 18 | 19 | 20 | 21 |
| | Composition (% by wt.) | | | | | | | | | |
| | 20% BBTF 80% MBTC | 5% ETFAA 95% MBTC | 5% FB 95% MBTC | 5% FBTF 95% MBTC | 5% PFBI 95% MBTC | 4.5% TFA 4.5% ACAN 91.0% MBTC | 4.6% TFA 2.3% ETAC 93.1% MBTC | 4.5% TFA 4.5% ACAN 91.0% MBTC | 4.5% TFA 4.5% MIBK 91.0% MBTC | 3.5 PFPA 96.5 MBTC |
| Rate of solution addition (ml/hr) | 2.9 | 15.1 | 15.1 | 15.1 | 22.3 | 17.8 | 19.4 | 20.5 | 29.5 | 6.5 |
| Temperature of carrier air (°C.) | 194 | 150 | 150 | 200 | 150 | 150 | 150 | 167 | 150 | 150 |
| Flow rate of carrier air (l/min.) | 2.5 | 2 | 2 | 2 | 2 | 12 | 12 | 2 | 2.3 | 10 |
| Relative humidity of air at 18° C. (%) | 6 | 100 | 44 | 14 | 25 | 47 | 47 | 14 | 14 | 0 |
| Temperature of heating block (°C.) | 675 | 650 | 650 | 650 | 650 | 655 | 690 | 650 | 650 | 625 |
| Deposition time (sec) | 30 | 4 | 6 | 10 | 7 | 5.3 | 4 | 8 | 7 | 33 |
| Sheet resistance R (ohm/sq) | 69 | 29 | 104 | 197 | 40 | 22 | 22 | 35 | 32 | 35 |
| Film thickness (nm) | 257 | 1960 | 1830 | 198 | 205 | 20 | 185 | 207 | 200 | 190 |

TABLE 1-continued

| Conductivity (ohm cm)⁻¹ | 564 | 1759 | 525 | 256 | 1222 | 2270 | 2460 | 1380 | 1562 | 1540 |
|---|---|---|---|---|---|---|---|---|---|---|

TFA = trifluoroacetic acid
MBTC = butyltin trichloride
TFAA = trifluoroacetic anhydride
TFE = 2,2,2-trifluoroethanol
TFM = trifluoromethyl bromide
ETFA = ethyltrifluoroacetate
BBTF = bromobenzotrifluoride
PFPA = pentafluoro propionic acid
DBTF = dibutyltin difluoride
ABF = ammonium bifluoride
AF = ammonium fluoride
ESTC = carbethoxyethyltin trichloride
ACAN = acetic anhydride
ETAC = ethyl acetate
BDTA = butyldichlorotin acetate
BCTA = butylchlorotin diacetate
MIBK = methyl isobutyl ketone

TABLE II

| | Example No. | | | | | |
|---|---|---|---|---|---|---|
| | 22 | 23 | 24 | 25 | 26 | 27 |
| | Composition (% by wt.) | | | | | |
| | 25.6% TFA<br>74.4% ESTC | 5% TFA<br>95% BDTA | 18% TFA<br>82% BCTA | 10% TFA<br>90% IBTC | 5% TFA<br>95% DIBTC | 7% TFA<br>10% ACAN<br>83% MTC |
| Rate of solution addition (ml/hr) | 14.4 | 30.6 | 30.6 | 30.6 | 30.6 | 15.5 |
| Temperature of carrier air (°C.) | 200 | 204 | 200 | 150 | 150 | 125 |
| Flow rate of carrier air (l/min) | 2 | 2 | 2 | 2 | 2 | 2 |
| Relative humidity of air at 18°C. (%) | 25 | 75 | 100 | 50 | 50 | 50 |
| Temperature of heating block (°C.) | 650 | 650 | 650 | 650 | 650 | 650 |
| Deposition time (sec) | 40 | 7 | 30 | 45 | 18 | 7 |
| Sheet resistance R (ohm/sq) | 24 | 35 | 39 | 38 | 32 | 34 |
| Film thickness (nm) | 206 | 201 | 1975 | 203 | 188 | 211 |
| Conductivity (ohm cm)$^{-1}$ | 2022 | 1421 | 1302 | 1296 | 1661 | 1394 |

| | Example No. | | | | | |
|---|---|---|---|---|---|---|
| | 28 | 29 | 30 | 31 | 32 | 33 |
| | Composition (% by wt.) | | | | | |
| | 5.5% TFA<br>22% MEOH<br>72.5% DMTC | 7.8% TFA<br>9.8% ACAN<br>82.4% DBTC | 8.3% TFA<br>8.3% ACAN<br>83.4% DTBTC | 8% ETFAA<br>10% MEK<br>82% DBTC | 7% ETFAA<br>10% ACAN<br>83% MTC | 4% TFA<br>96% TT |
| Rate of solution addition (ml/hr) | 15.5 | 22.3 | 22.3 | 22.3 | 22.3 | 6.5 |
| Temperature of carrier air (°C.) | 150 | 200 | 175 | 250 | 150 | 150 |
| Flow rate of carrier air (l/min) | 2 | 2 | 2 | 3 | 2 | 10 |
| Relative humidity of air at 18° C. (%) | 50 | | | | | |
| Relative humidity of air (%) | | 50 | 50 | 100 | 50 | 47 |
| Temperature of heating block (°C.) | 650 | 650 | 650 | 650 | 650 | 560 |
| Deposition time (sec) | 15 | 27 | 7.5 | 60 | 7.5 | 18 |
| Sheet resistance R (ohm/sq) | 36 | 30 | 31 | 62 | 37 | 30 |
| Film thickness (nm) | 200 | 201 | 205 | 230 | 220 | 200 |
| Conductivity (ohm cm)$^{-1}$ | 2389 | 1658 | 1574 | 701 | 1228 | 1667 |

IBTC = isobutyltin trichloride
DIBTC = diisobutyltin dichloride
MTC = methyltin tricholoride
DBTC = dibutyltin dichloride
DMTC = dimethyltin dichloride
DTBTC = di-t-butyltin dichloride
OBTC = 3-oxybutyltin trichloride
MEOH = methanol
MEK = methylethylketone
TT = Tin Tetrachloride

TABLE III

| | Example No. | | | | | | |
|---|---|---|---|---|---|---|---|
| | 34 | 35 | 36 | 37 | 38 | 39 | 40 |
| | Compostition (% by wt) | | | | | | |
| | 100% MBTC | 30% DBTF<br>70% MBTC | 20% ABF<br>70% MBTC | 20% AF<br>80% MBTC | 20% ETFA<br>80% MBTC | 20% TFE<br>80% MBTC | 20% TFA<br>80% MBTC |
| Rate of solution addition (ml/hr) | | | | | | | |
| Temperature of carrier air (°C.) | 260–280 | 260–280 | 260–280 | 260–280 | 260–280 | 260–280 | 260–280 |
| Flow rate of carrier air (l/min) | 10 | 10 | 10 | 10 | 10 | 10 | 10 |
| Relative humidity of air (%) | 6 | 6 | 6 | 6 | 6 | 6 | 6 |
| Temperature of heating block (°C.) | 650 | 650 | 650 | 650 | 650 | 650 | 650 |
| Deposition time (sec) | 60 | 60 | 60 | 60 | 30 | 30 | 30 |
| Sheet resistance R (ohm/sq) | 295 | 32 | 19 | 26 | 82 | 106 | 120 |
| Film thickness (nm) | 237 | 215.9 | 249 | 216 | 201 | 237 | 133 |
| Conductivity (ohm cm)$^{-1}$ | 143 | 1459 | 2114 | 1781 | 607 | 398 | 627 |

TABLE IV

Deposition Rate vs. Relative Humidity[1]

| % RH | Deposition Rate (nm/sec) |
|---|---|
| 0 | 5.1 |
| 14 | 6.8 |
| 47 | 7.9 |
| 71 | 7.0 |
| 100 | 8.2 |

[1]95.5% MBTC, 4.6% TFA, 2.3% ETAC. Addition rate 3.24 ml/hr at a temperature of 150° C., air flow of 12 l/min and a block temperature of 685° C.

TABLE V

Deposition Rate vs. Relative Humidity[1]

| % RH | Deposition Rate (nm/sec) |
|---|---|
| 14 | 23.6 |
| 50 | 51.8 |
| 75 | 57.2 |
| 100 | 63.5 |

[1]91% MBTC, 4.5% TFA, 4.5% TFA, 4.5% AcAn. Addition rate −30.6 mil/hr, air temperature −150° C., block temperature 650° C.; air flow 12 l/min.

TABLE VI

Deposition Rate vs. % Relative Humidity

| Compound Composition | % R.H. | Deposition Rate (A/sec) |
|---|---|---|
| 95% BDTA/5% TFA[1] | 25 | 204 |
| | 75 | 289 |
| 95% DIBTC/5% TFA[2] | 6 | 70 |
| | 50 | 132 |
| | 100 | 167 |
| 74.4% ESTC/25.6% TFA[3] | 25 | 46 |
| | 75 | 61 |

[1]Feed rate 30.6 ml/hr., air temp. 200° C., sheet resistance 38–49 ohms/sq., block temp. 650° C.
[2]Feed rate 30.6 ml/hr., air temp. 200° C., sheet resistance 32–34 ohms/sq., block temp. 650° C.
[3]Feed rate 14.4 ml/hr., air temp. 200° C., sheet resistance 32–36 ohms/sq., block temp. 650° C.

TABLE VII

Deposition Rate vs. Air Flow

| Composition | Air Flow (l/min.) | Deposition Rate (A/sec.) |
|---|---|---|
| 91% MBTC/4.5% TFA/4.5% AcAn[1] | 5 | 260 |
| | 10 | 320 |
| | 20 | 440 |

TABLE VIII

Deposition Rate vs. MBTC Concentration

| Concentration (mole MBTC/mol air × $10^{-3}$) | Deposition Rate (nm/sec) |
|---|---|
| 0.67 × 10 | 7.9 |
| 1.35 | 13.8 |
| 2.7 | 28.5 |
| 4.0 | 45.0 |

93.5% MBTC/4.6% TFA/2.3% ETAC
Air temperature, 150° C., block temperature, 690° C., relative humidity 47%.

TABLE IX

Deposition Rate vs. Block Temperature

| Block Temperature* (°C.) | Deposition Rate |
|---|---|
| 391 | 20 |
| 500 | 122 |
| 605 | 260 |
| 634 | 411 |
| 698 | 411 |

*Glass surface temperature was about 100° C. below the block temperature.

TABLE X

| Cosolvent | | | |
|---|---|---|---|
| n-Hexane (ml) | 1 | 1.5 | 2 |
| at 20° C. | clear | clear | clear |
| at −15° C. | 6/19 | 5/20 | 4/21 |
| Ethylacetate (ml) | 0.3 | 0.4 | 0.5 |
| at 20° C. | clear | clear | clear |
| at −15° C. | 5/20 | 3/22 | clear |
| Acetic anhydride (ml) | 0.3 | 0.4 | 0.5 |
| at 20° C. | clear | clear | clear |
| at −15° C. | 5/20 | 2.23 | clear* |
| Acetic acid (ml) | 0.3 | 0.4 | 0.5 |
| at 20° C. | turbid | clear | clear |
| at −15° C. | 6/19 | — | 1/24 |

Ethylacetate and acetic anhydride show best performance as cosolvents at low temperature.

TABLE XI

Effect of Cosolvent on $SnCl_4$ Crystal Formation

| | Wall crystals gone | Liquid clear | Cool down to −16° C. | After 3 days +20° C. |
|---|---|---|---|---|
| 1. Ethylacetate | 0.5 g | 2 g | clear | clear |
| 2. Acetic acid | 0.4 | 2 | clear | clear |
| 3. Aceticanhydride | 0.4 | 1.4 | clear | clear* |
| 4. Methanol | 0.4 | 0.6 | slight haze | clear bubble on bottom |
| 5. Trifluoroethanol | 0.8 | turbid** | 2 mm top layer on 20 mm turbid on mixing. | |

*Brown color after standing, see note previous table.
**More turbidity on TFA addition up to 1.5 g.

TABLE XII

Effect of Acetic Anhydride on Crystal Formation

| pph AcAn | 1 h = 15° C. | 8 h −15° C. | 24 h −15° C. | +68 h +20° C. |
|---|---|---|---|---|
| 0 | turbid | turbid + crystal | 1 mm top layer crystal | clear, crystal |
| 1 | turbid | turbid, some crystal | 0.5 mm top layer crystal | clear, less crystal |
| 2 | clear | clear | clear, | clear, some |

TABLE XII-continued

| | Effect of Acetic Anhydride on Crystal Formation | | | |
|---|---|---|---|---|
| pph AcAn | 1 h = 15° C. | 8 h −15° C. | 24 h −15° C. | +68 h +20° C. |
| 3 to 6 | clear | clear | no crystal clear, no crystal | crystal clear, no crystal |

As can be seen from the data, 3 pph of ACAN is sufficient to prevent crystal formation at 0.4 pph of SnCl$_4$.

What is claimed is:

1. A process for producing a coated glass having a surface resistance of less than about 40 ohms/square at a thickness less than about 250 nm, an IR reflectivity of greater than about 70%, visible transmittance of greater than about 80% and solar transmittance of greater than about 70%, comprising utilizing a chemical vapor deposition process wherein a coating solution is introduced into a carrier gas stream, said solution comprising a substantially solvent free mixture of an organotin chloride and a reactive fluorine compound soluble in or miscible with said organotin chloride, said organotin is represented by the formula RSnCl$_3$ where
    R is halogen or a C$_1$ to C$_4$ straight or branched chain alkyl, phenyl or R'CH$_2$CH$_2$—;
    R' is R"OOC or CH$_3$OC—;
    R" is a C$_1$ to C$_4$ alkyl;
    or by the formula R'''$_2$SnCl$_2$  II where
    R''' is a C$_1$ to C$_4$ straight or branched chain alkyl;
    or by the formula R"SnCl$_n$(O$_2$R")$_{3-n}$;  III where
    R" is a C$_1$ to C$_4$ alkyl or substituted alkyl;
    n is 1 or 2;
    the reactive fluorine compound is an organic compound having at least one fluorine atom located alpha or beta to a functional group, wherein the functional group is selected from the group consisting of carboxylic acid, ester, aldehyde, anhydride, nitrile, ketone, ether, amine, acid halide, alcohol, halogen, amide and hydrogen; said mixture having a vaporization temperature below about 200° C. and a decoposition temperature substantially above the vaporization temperature of the mixture and below about 650° C.; and the gas stream contains sufficient water vapor such that the relative humidity of the gas stream at 18° C. is about 6% to about 100%.

2. The process according to claim 1 wherein the organic fluoride dopant is trifluoroacetic acid, ethyl-4,4,4-trifluoroacetoacetate, perfluorobutyl iodide, trifluoroacetic anhydride, or ethyltrifluoroacetate.

3. The process according to claim 1 wherein the organotin compound is monobutyltin trichloride, methyltin trichloride isobutyltin trichloride, butyl dichlorotin acetate, butyldichlorotin dicetate, diisobutyltin dichloride, methyltin trichloride, dimethyltin dichloride, dibutyltin dichloride di-t-butyltin dichloride or tin tetrachoride.

4. The process according to claim 1 wherein the organotin compound is monobutyltin trichloride.

5. The process according to claim 4 wherein the organic fluoride dopant is trifluoroacetic acid, ethyl 4,4,4-trifluoroacetoacetate perfluorobutyl iodide, trifluoroacetic anhydride or ethyltrifluoroacetate.

6. The process according to claim 1 wherein the relative humidity is about 14 to about 80%.

7. The process according to claim 6 wherein the relative humidity is about 35 to about 60%.

8. A process according to claim 1 wherein the mixture of organotin compound and fluoride dopant includes a solubilizer.

9. The process according to claim 8 wherein the solubilizer is acetic anhydride, ethyl acetate, MIBK or butyraldehyde.

10. The process according to claim 1 wherein the carrier gas is air.

* * * * *